United States Patent [19]

Risen, Jr. et al.

[11] Patent Number: 4,727,00[7]

[45] Date of Patent: * Feb. 23, 198[8]

[54] HOLOGRAPHIC DEVICES EMPLOYING METALLIC CHARGE-TRANSFER SALTS

[75] Inventors: William M. Risen, Jr., Rumford, R.I.; Efstratios I. Kamitsos, Athens, Greece

[73] Assignee: Brown University Research Foundation, Inc., Providence, R.I.

[*] Notice: The portion of the term of this patent subsequent to Sep. 23, 2003 has been disclaimed.

[21] Appl. No.: 815,442

[22] Filed: Dec. 31, 1985

Related U.S. Application Data

[62] Division of Ser. No. 740,183, May 31, 1985, Pat. No. 4,613,553.

[51] Int. Cl.$^4$ .......................... G03C 1/49; G03H 5/00
[52] U.S. Cl. .......................... 430/1; 350/3.75; 357/1; 357/2; 357/8; 357/29
[58] Field of Search .......................... 430/1, 2, 199, 200, 430/201, 296, 334, 338, 341, 346, 495, 616, 617, 942, 964; 357/1, 2, 8, 29; 350/3.61

[56] References Cited

U.S. PATENT DOCUMENTS

| | | | |
|---|---|---|---|
| 4,264,665 | 4/1981 | Kozima et al. | 430/58 |
| 4,312,935 | 1/1982 | Engler et al. | 430/296 |
| 4,312,936 | 1/1982 | Engler et al. | 430/296 |
| 4,338,392 | 7/1982 | Engler et al. | 430/270 |
| 4,371,883 | 2/1983 | Potember et al. | 357/[x] |
| 4,613,553 | 9/1986 | Risen et al. | 430/[x] |

OTHER PUBLICATIONS

Kamitsos et al., *Solid State Communications*, vol. 00, N[o] 0, 1982, pp. 603–607.
Kamitsos et al., vol. 79, *Journal of Chemical Physics*, p[p] 5808–5819 (1983), No. 12.
Kamitsos et al., vol. 79, *Journal of Chemical Physics*, p[p] 477–482, 1983, No. 1.
Kamitsos et al., *Solid State Communications*, vol. 45, N[o] 2, pp. 165–169, 1983.

*Primary Examiner*—Richard L. Schilling
*Attorney, Agent, or Firm*—Thomas J. Engellenner

[57] ABSTRACT

Metallic salts of organic charge-transfer agents, such a[s] TCNQ, TNAP, TCNE and DDQ and their derivative[s] can be processed by an electron beam for a variety o[f] useful electronic and optical applications. The metalli[c] charge transfer salts can be used to deposit high resol[u]tion conductive lines directly without developing sol[u]tions or subsequent metallization steps. The compound[s] can also be employed in the conventional manner a[s] resists for doping (i.e., ion diffusion or implantation) an[d] to diffuse metals into substrates. In particular, elecroni[c] devices, optical devices and image-storage devices ar[e] disclosed which can be formed by simple electron bea[m] processed of metal charge-transfer salt films deposite[d] on substrates.

8 Claims, 13 Drawing Figures

VAPOR DEPOSITION

HEAT INDUCED CONVERSION

ELECTRON BEAM PROCESSING

ELECTRON BEAM PROCESSING

OXIDATION

ETCHING

ELECTRON BEAM PROCESSING

THERMAL DIFFUSION

ETCHING

HOLOGRAPHIC DEVICES EMPLOYING METALLIC CHARGE-TRANSFER SALTS

This is a division of application Ser. No. 740,183 filed May 31, 1985, now U.S. Pat. No. 4,613,553, issued Sept. 23, 1986.

BACKGROUND OF THE INVENTION

This invention relates to the processing of metallic salts of charge transfer agents as well as devices formed by such methods. In particular, techniques for processing metal-tetracyanoquinodimethane (TCNQ) salts, metal-tetracyanonaphthoquinodimethane (TNAP) salts, metal-tetracyanoethylene (TCNE) salts, dichlorodicyanobenzoquine (DDQ) salts and similar metallorganic semiconductor salts are disclosed to form resists, active electronic devices and image-storage devices, and to dope substrates and modify the bulk or surface properties of materials.

Organic electron-acceptors and their metallic salts have been studied by numerous researchers. Cuprous and other metallic salts of TCNQ, for example, were disclosed by Melby et al. in "Substituted Quinodimethanes II. Anionradical Derivatives and Complexes of 7,7,8,8 Tetracyanoquinodimethane," Vol. 84, *J. of American Chemistry*, pp. 3374–3387 (1962). The electrical switching properties of Cu-TCNQ films were disclosed by Potember et al. in article "Electrical Switching and Memory Phenomena in Cu-TCNQ Thin Films," Vol. 34, *Applied Physics Letters*, pp. 405–407 (1979) and further described by the present inventors and a colleague in an article "Raman study of the Mechanism of Electrical Switching in Cu-TCNQ Films," Vol. 42, *Solid State Communications*, pp. 561–565 (1982). The optical properties of such films were disclosed by the present inventors in an article "Optically Induced Transformations of Metal TCNQ Materials," Vol. 45, *Solid State Communications*, pp. 165–169 (1983). The teachings of the above referenced articles are incorporated herein by reference.

Despite the teachings in this art, few commercial applications of metallic-TCNQ salts and the like have been found to date. In the field of semiconductor processing, for example, there currently is a significant need for resist materials that can be patterned and developed to yield sub-micron structures for active electronic devices. Similarly, there is a need for better memory materials for both reversible and "read-only" information storage devices. High resolution image storage is yet another area where imaging materials of high quality would satisfy a substantial need.

SUMMARY OF THE INVENTION

It has been discovered that metallic salts of organic charge-transfer agents, such as TCNQ, TNAP, TCNE and DDQ and other electron acceptors, can be processed by electron beams for a variety of useful electronic and optical applications. In one aspect of the invention, metal charge transfer salts are employed to deposit high resolution conductive lines directly without developing solutions or subsequent metallization steps. The compounds disclosed herein can also be employed in conventional manners as resists to form masks or patterns upon semiconductor substrates for doping (i.e., ion diffusion or implantation) or other electronic device fabrication steps.

Electron beam processing sufficient to cause the dissociation of the metal-organic salt into its free valent species can also be used to deposit a controlled amount of a dopant metal in the processed region. When the system is heated, the metal atoms so placed form a source of doping atoms which can be diffused into the substrate as dopants. By this method, controlled doping of semiconductors, metals and insulators can be achieved in the pattern of exposure to the electron beam. The preferred embodiment depends on the desired modification and the properties of the substrate and the chemical properties of the substrate, salt and etchant. For example, in the case of LiTCNQ as the film, lithium doping can be achieved by thermal diffusion in the processed regions and the unprocessed LiTCNQ can be removed using solvents such as acetonitrile. As another example, in the case of AgTCNQ as the thin film, Ag doping to modify the bulk or surface properties of the substrate can be achieved by thermal diffusion in the processed regions and the unprocessed AgTCNQ is removed by other etchants.

In another aspect of the invention, the processing techniques are used to form electronic devices. Electrically controlled bistable threshold and memory switches can be fabricated by electron beam treatment of films formed from metallic charge transfer salts to yield in situ electrodes in those regions of the film exposed to electron bombardment. Structures formed in this manner include, for example, semiconductor materials (i.e., the unexposed metallic charge transfer salt sandwiched between two electrodes. The semiconductor can be switched from a high impedance state and a low impedance state by applying an electric field. The threshold for switching or memory behavior is dependent upon the particular transfer agent and metal chosen, the thickness of the film and the temperature. The duration of the switching or memory behavior is also dependent on the material, thickness and temperature as well as the strength of the applied field. One important advantage of devices fabricated by the electron processing techniques of the present invention is that the devices so formed are essentially planar and do not require multiple masking steps for electrode deposition or metallization of contacts.

In a further aspect of the invention, electron beam processing can also be employed to form light activated switches and memory elements. Upon exposure to light, planar sandwich structures with in situ formed electrodes, can also be switched from a high impedance state to a low impedance state. Such optical devices can find use in sensors, memory elements, optical computers and optical communications systems. In these applications the threshold and duration of the switching or memory behavior will be depend not only on materials, thickness and temperature but also on the wavelength and energy of the light.

In yet another aspect of the invention, it has been discovered that metallic charge transfer salts deposited on suitable substrates can be processed by electron beams to generate very high resolution holograms and the like. Selective activation of the electron beam to dissociate the salt and volatize the organic component in a pixel-by-pixel manner is employed to produce holographic images. Processing of pixels on the order of one micron or less is achievable. In one embodiment the metallic charge-transfer salt is deposited as a film on a highly reflective substrate such as a silver or copper mirror surface. In those areas where the electron beam is activated, the constituents of the salt are converted to free valent species, and the organic component is allowed to escape by sublimation. The resulting pattern of salt and metal yield a reproduced image by reflection upon illumination. In another embodiment, a glass, quartz or other transparent substrate can be employed to form holographic images suitable for viewing by transmittance or projection (i.e., like photographic slides). Hologram formation by the techniques disclosed herein should not only allow binary (black or white) processing of each pixel but also permit gradation in shading by appropriate controls over the duration of electron beam exposure.

The mechanisms underlying the present invention consist of two main reactions. The first mechanism involves the reversible dissociation of the salt constituents into their free valent species which is depicted for partially transformed one-to-one metal charge transfer salts as:

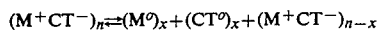

where M is the metal constituent and CT is the organic charge transfer agent. This reaction is known to occur in the presence of an applied electric field or exposure to light of appropriate wavelength and energy. This reaction is used herein to achieve the threshold and memory switching behavior of the electronic and optical devices described below. Non-planar electronic switches employing the same mechanisms have been disclosed, for example, in U.S. Pat. No. 4,371,883 issued to Potember et al. on Feb. 1, 1983, the teachings of which are incorporated herein by reference.

The second mechanism, which forms the basis for the electron beam processing steps disclosed herein, involves the irreversible dissocation of the salt constituents. In this reaction the constituents are not only converted into free valent species but the organic constituent sublimes to leave a metal deposit in those areas exposed to electron bombardment:

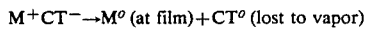

The charge transfer agents useful in the present invention include organic electron acceptors, such as tetracyanoquinodimethane (TCNQ), tetracyanonaphthoquinodimethane (TNAP), tetracyanoethylene (TCNE), dichlorodicyanobenzoquinone (DDQ), and derivatives of these compounds. Metals useful in the present invention include copper, silver, platinum, palladium, nickel, cobalt, zinc, cadmium, iridium, osmium, and rhodium. Additionally, lithium, potassium and similar metals can also be useful as deposited dopant sources. More generally, metals from Groups 1, 2, 11, 12 and 13 of the periodic table of elements (new IUPAC-ACS classification) can form charge transfer salts useful in practice of the present invention. Specifically, the copper and silver salts of charge transfer agents identified in Table 1 below are illustrative of various derivatives and can find use in particular applications.

TABLE 1

| | |
|---|---|
| CuTCNQ | AgTCNQ |
| CuTCNQ(OMe) | AgTCNQ(OMe) |
| CuTCNQ(OMe)$_2$ | AgTCNQ(OMe)$_2$ |
| CuTCNQ(OMe) (OEt) | AgTCNQ(OMe) (OEt) |
| CuTCNQ(OMe) (O—i-Pr) | AgTCNQ(OMe) (O—i-Pr) |
| CuTCNQ(OMe) (O—i-Bu) | AgTCNQ(OMe) (O—i-Bu) |

TABLE 1-continued

| | |
|---|---|
| CuTCNQ(O—i-C$_2$H$_5$) | AgTCNQ(O—i-C$_2$H$_5$) |
| CuTCNQ(OEt) (SMe) | AgTCNQ(OEt) (SMe) |
| CuTCNQClMe | AgTCNQClMe |
| CuTCNQBrMe | AgTCNQBrMe |
| CuTCNQIMe | AgTCNQIMe |
| CuTCNQCl | AgTCNQCl |
| CuTCNQBr | AgTCNQBr |
| CuTCNQI | AgTCNQI |
| CuTCNQ(Ome) (OCH$_3$)$_2$ | AgTCNQ(Ome) (OCH$_3$)$_2$ |
| CuTCNQ(CN$_2$) | AgTCNQ(CN)$_2$ |
| CuTCNQ(Me) | AgTCNQ(Me) |
| CuTCNQ(Et) | AgTCNQ(Et) |
| CuTCNQ(i-Pr) | AgTCNQ(i-Pr) |
| CuTCNQ(i-Pr)$_2$ | AgTCNQ(i-Pr)$_2$ |
| CuTCNQ-F$_2$ | AgTCNQ-F$_2$ |
| CuTCNQ-F$_4$ | AgTCNQ-F$_4$ |
| CuTNAP | AgTNAP |
| CuTCNE | AgTCNE |
| CuDDQ | AgDDQ |

The invention will next be described in connection with certain preferred embodiments; however, it should be clear various changes and modification can be made without departing from the spirit or scope of the invention. For example, in the illustrations described below, the metallic charge-transfer salts are preferably formed by first depositing alternating layers of metal and the charge transfer agent, and then converting the two constituents into a salt by heating. It should be clear that other methods of salt formation can be substituted, such as chemical transformations and depositions from solutions. Additionally, the electronic and optical structures described herein can be incorporated into larger systems and devices. For example, memory cells employing the devices described below can include conventional circuitry for reading the memory state as well as setting and resetting the device.

DETAILED DESCRIPTION

Figure 1A:
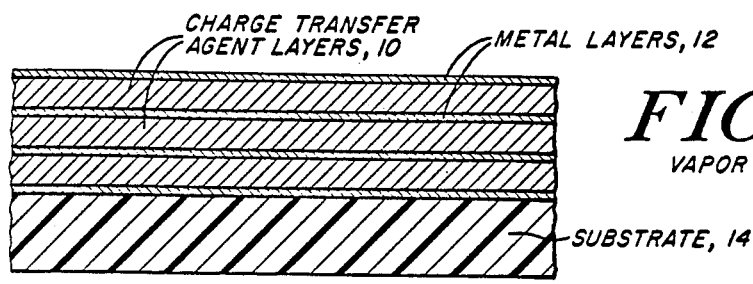
FIGS. 1a–1c are schematic, cross-sectional illustrations of various steps in the processing of metallic charge-transfer salts according to the invention.
Figure 1B:
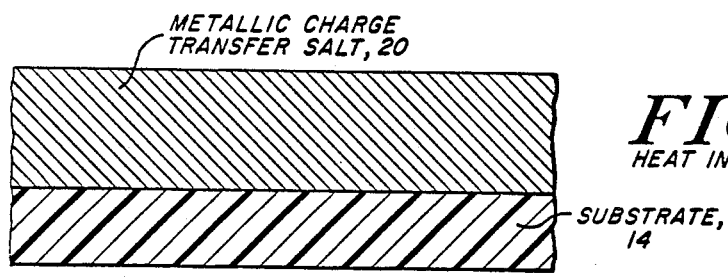
Figure 1C:
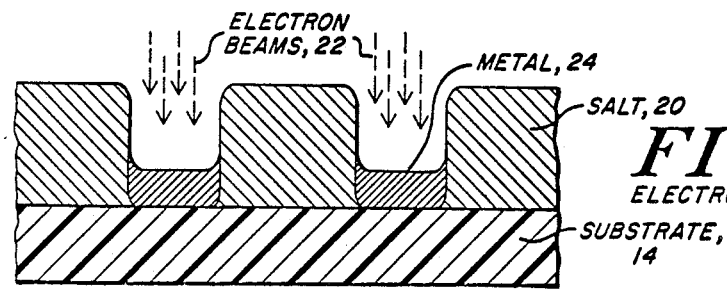

In FIGS. 1a–1c the basic steps in electron beam processing according to the invention are shown. In FIG. 1a, one preferred technique for formation of the metallic charge-transfer salt by vapor deposition as shown. Alternating layers of the charge-transfer agent 10 and metal 12 are deposited upon a substrate 14. For copper and silver salts, such as CuTCNQ and AgTCNQ, it is typically preferred that the molar ratio of the two constituents be maintained close to 1:1 but ratios in the range of 1:1 to 1:3 (metal:charge transfer agent) can be appropriate for other metal salts and excesses of either metal or charge transfer agent can be incorporated for special purposes. Because of the density differences between the organic and metal layers, the organic layers are substantially thicker. For example, in the case of the formation of CuTCNQ, alternating layers of about 20-200 angstroms Cu and 400-5000 angstroms TCNQ are deposited on the substrate. Although the schematic drawing shows only three layers, it should be appreciated that the number of layers deposited in this manner can be quite large. It is also preferred that the initial and final deposition layers be metal layers 12 to increase the integrity of the structure shown in FIG. 1a during subsequent processing steps. The substrate can be a conductor, semiconductor or insulator, including materials such as quartz, glass, copper, silver, potassium bromide, silicon or germanium.

In FIG. 1b, the conversion of the layered structure to a salt is shown schematically. Such conversion occurs readily when the layered structure is heated at a particular temperature and for a particular time. For example, in the case of CuTCNQ heating at about 90° C. or above for a few minutes is sufficient for complete conversion of the salt. If excess TCNQ is present, it can be removed by solvent wash at this time. The heat-induced conversion will occur in a vapor deposition chamber or under an inert atmosphere. In the case of some of the metals, such as copper or silver, it is possible to conduct the conversion in an open air oven if the layered structure is not exposed to air for more than a few minutes handling time. In the case of more reactive or less easily passified metals, exclusion of air, water or other reactive species is recommended and the preferred method is reaction in the vapor deposition chamber followed by washing out any excess charge transfer agent.

In FIG. 1c the effects of electron beam processing are shown schematically. In those regions of the salt 20 which are exposed to electron beam 22, the salt decomposes into a constituent free valent species. The energy of the electron beam is sufficient to cause the sublimation of the organic charge transfer agent, leaving only the metal constituent 24. Vacuum conditions are recommended to encourage sublimation so that an electron beam source of lower power and intensity can be used. Metal regions on the substrate surface, formed in this manner can be utilized in semiconductor fabrication for conductive lines and contact points.

Figure 2A:
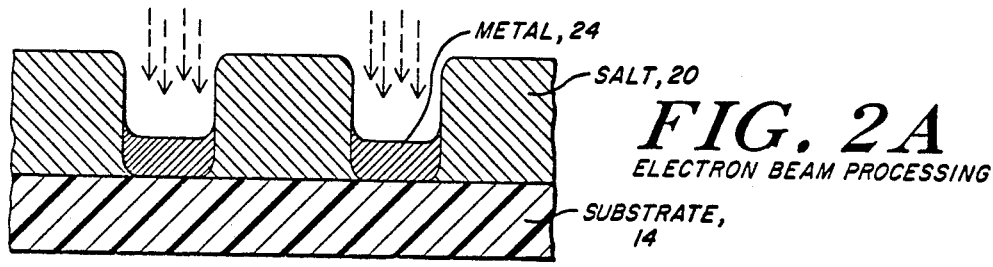
FIGS. 2a–2c are schematic, cross-sectional illustrations of further steps in the processing of metallic charge-transfer salts according to the invention.
Figure 2B:
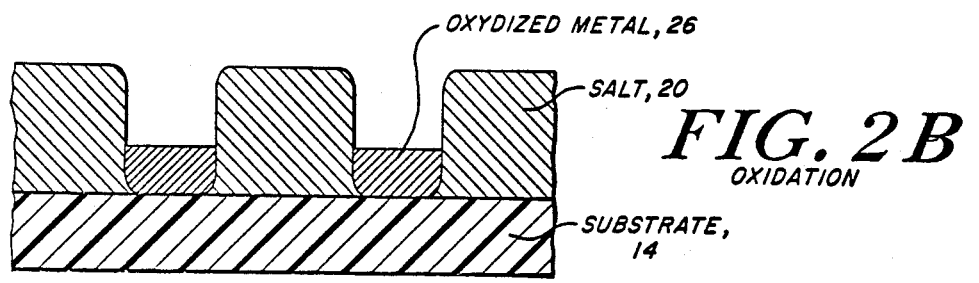
Figure 2C:
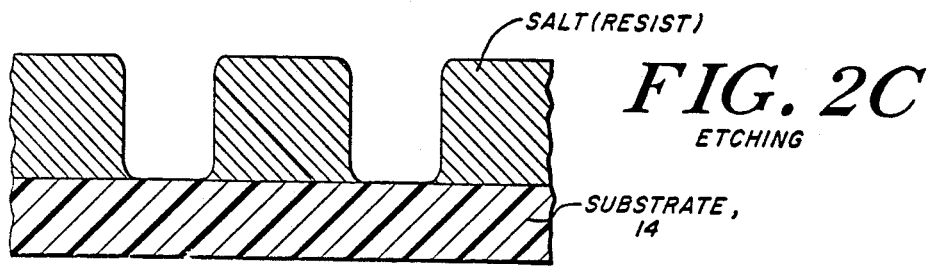

In FIGS. 2a-2c further steps in processing metallic charge-transfer salts according to the invention are shown. The structure shown in FIG. 2a is essentially the same as that shown in FIG. 1c, that being the result of electron beam processing. The metal regions can be removed as shown in FIGS. 2b and 2c by first oxidizing the metal to yield a metal oxide or other salt 26 and then etching this oxide or salt away with a suitable etchant, such as an acid or basic etch solution. Because the metal oxide or salt is substantially more succeptable to particular etchants, the metal regions are selectively removed leaving the salt-covered regions of the substrate intact. The substrate can then be doped by conventional diffusion or implantation techniques in the exposed regions or other standard fabricating techniques such as the growth of different layers, the etching of the substrate, itself, or lift-off processes can be carried out. The remaining salt resist on the substrate can be removed by more powerful etching solutions or by following the steps described in FIGS. 2a-2c again after the further fabrication steps have been conducted on the exposed regions of the substrate.

Figure 3A:
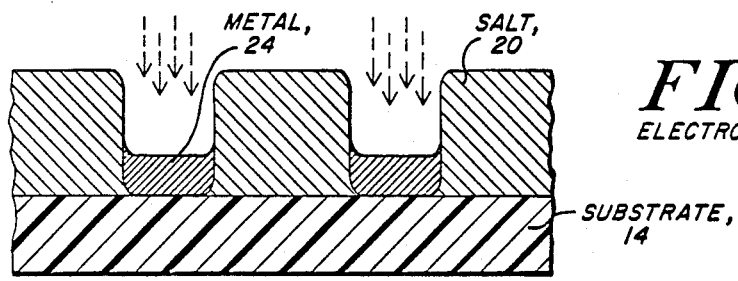
FIGS. 3a–3c are also schematic, cross-sectional illustrations of further steps in the processing of metallic charge transfer salts according to the invention.
Figure 3B:
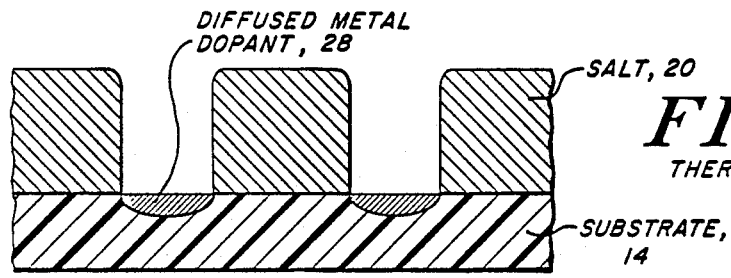
Figure 3C:
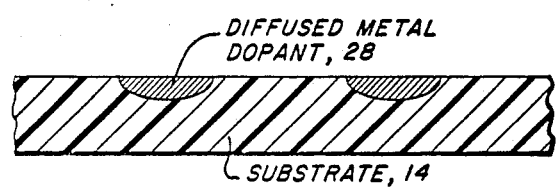

FIGS. 3a-3c also illustrate further steps in processing metallic charge-transfer salts according to the invention. The structure shown in FIG. 3a is essentially the same as that shown in FIG. 1c, that being the result of electron beam processing. By heating the substrate as shown in FIG. 3b, the deposited lithium, potassium or similar metal regions can be thermally diffused into the substrate as a dopant or the like. For example, in the case of lithium doping, heating the substrate to about 150° C. or above can induce diffusion. After diffusion the remaining metal and salt can be removed by suitable etchants (e.g., acetonitrile for LiTCNQ) as shown in FIG. 3c. As another example, in the case of AgTCNQ as the thin film, Ag doping to modify the bulk or surface properties of the substrate can be achieved by thermal diffusion in the processed regions and the unprocessed AgTCNQ is removed by other etchants.

Figure 4:
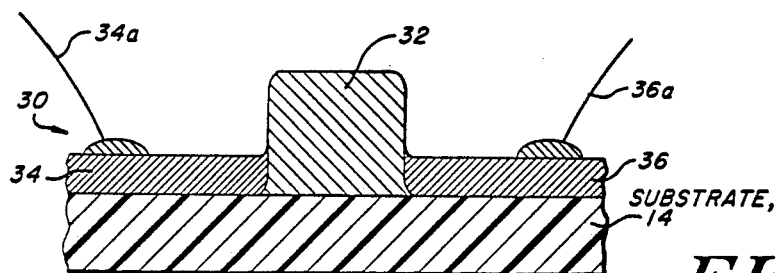
FIG. 4 is a schematic, cross-sectional illustration of an electronic switch or memory device fabricated according to the invention.

In FIG. 4 an illustrative embodiment of an electronic device 30 fabricated according to the present invention is shown comprising a substrate 14, a semiconductor material 32, formed from an unexposed metallic charge transfer salt, a first electrode 34 and a second electrode 36. The structure can be formed from a single film of metallic charge-transfer salt in which the first and second electrodes, sandwiching the semiconductor, are fabricated by exposure to an electron beam. Contact 34a and 36a are shown schematically, applying current to electrodes 34 and 36, respectively. The device shown in FIG. 4 can be a two terminal threshold or memory switch which is stable in either a high or low impedance state. The transition from the high to low impedance state occurs when the electric field which exceeds a threshold level is applied across the semiconductor 32. The field can be easily generated by providing a voltage, by any of various known means, across the two electrodes 34 and 36. As a memory switch, the device 30 remains in the low impedance state after the initial applied field (which exceeds the threshold) is removed. As a threshold switch, the device 30 immediately returns to a high impedance state when the applied field falls below a minimum holding value.

Figure 5:
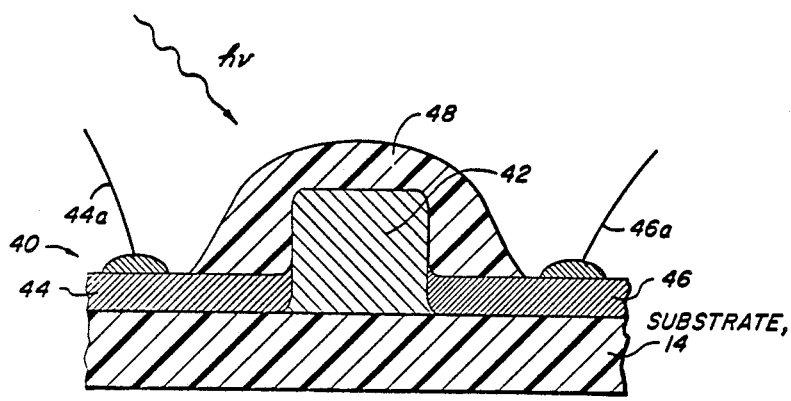
FIG. 5 is a schematic, cross-sectional illustration of an optical switch or memory device fabricated according to the invention.

In FIG. 5, an optical threshold or memory switch 40 is shown which also can be a two-terminal device which is stable in either a high or low impedance state. The optical device 40 comprises a semiconductor material 42 (again formed from the unexposed salt), sandwiched between a first electrode 44 and a second electrode 46 (both formed from the electron-exposed regions of the salt). Contacts 44a and 46a are shown schematically providing current to electrodes 44 and 46, respectively. An encapsulation layer 48 is recommended to prevent the loss of the charge-transfer agent during repeated duty cycling. The encapsulation layer 48 can be formed, for example, as an evaporated layer of a transparent insulator, semiconductor or conductor depending upon the application. Preferred encapsulating materials include oxides such as silica (e.g. by quartz evaporation), alumina, tin oxide and indium tin oxide. As an optical threshold or memory switch, the device 40 shown in FIG. 5 can operate in either a high or low impedance state depending upon exposure to light. One preferred wavelength range for light-induced impedance transitions is visible light from about 300 to about 800 nanometers, which includes important absorption bands of CuTCNQ, AgTCNQ and their analogs. As a memory switch, the device 40 remains in the low impedance state after the light is removed. As a threshold switch, the device 40 immediately returns to a high impedance state when the light is removed.

Figure 6:
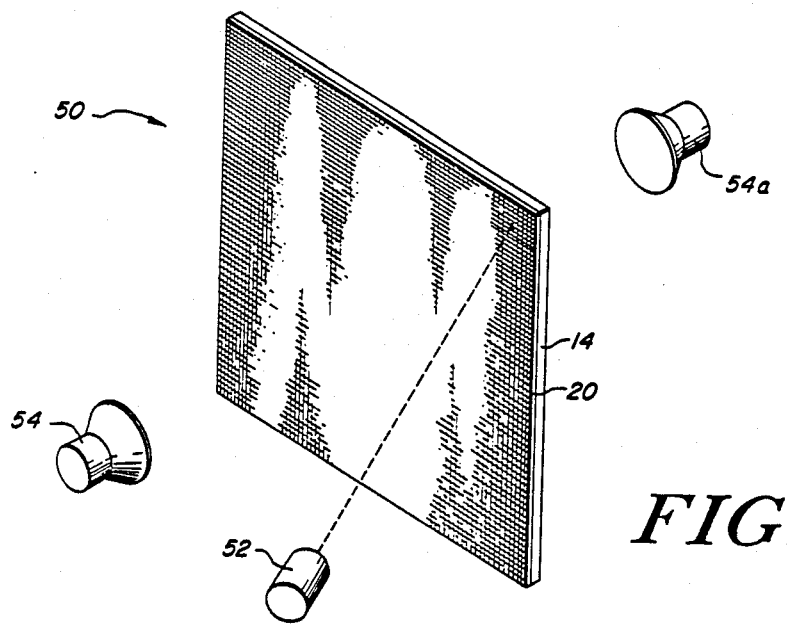
FIG. 6 is a schematic, prospective view of a holographic engraving and viewing system according to the invention.
Figure 6A:
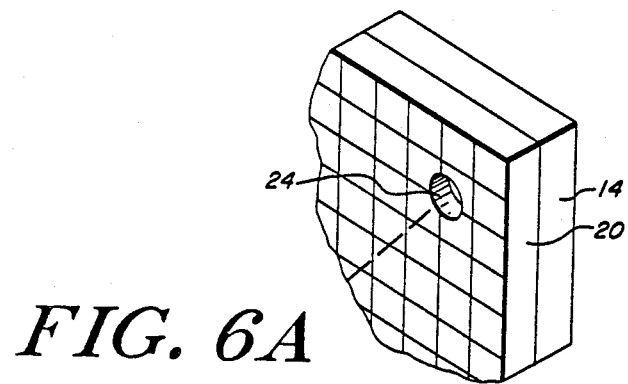
FIG. 6a is a more detailed schematic view of a holographic plate prepared according to the invention.

In FIG. 6 the use of the present invention to generate high resolution holograms is shown schematically. As shown in more detail in FIG. 6a, a holographic plate 50 comprised of a substrate 14 and a salt film 20 is selectively exposed pixel-by-pixel via electron beam source 52. In those areas where the electron beam is activated, the constituents of the salt are converted to free valent species, and the organic component is allowed to escape by sublimation. The holographic image can be read by illumination via light source 54 to obtain a reflected image. When the reflection-mode is employed, it is preferred that the substrate 14 be a highly reflective material such as a silver or copper mirror surface. Alternatively, substrate 14 can be glass, quartz or another transparent material and illumination source 54a can be employed to obtain a holographic image for viewing by transmittance or projection.

We claim:

1. A holographic system for recording images, the system comprising
a holographic plate having a substrate and a film of a metallic charge transfer salt disposed thereon,
an electron beam engraving means having sufficient energy and resolution to convert the salt in exposed regions into the free valent species of its constituents and cause the sublimation of the organic charge transfer constituent for engraving the plate with an image, and
an illumination means for illuminating the plate to view the image.

2. The system of claim 1 wherein the salt film of the plate comprises a metal constituent chosen from the group of copper, silver, nickel, cobalt, zinc, cadmium, platinum, palladium, iridium, osmium, and rhodium and an organic electron acceptor constituent chosen from the group of tetracyanoquinodimethanes, tetracyanonapthoquinodimethanes, tetracyanoethylenes, dichlorodicyanobenzoquinones and derivatives thereof.

3. The system of claim 2 wherein the salt is CuTCNQ.

4. The system of claim 2 wherein the salt is AgTCNQ.

5. The system of claim 1 wherein the substrate is a reflective substrate.

6. The system of claim 5 wherein the plate substrate includes a copper mirror surface.

7. The system of claim 5 wherein the plate substrate includes a silver mirror surface.

8. The system of claim 1 wherein the plate substrate is a transparent substrate.

* * * * *